(12) United States Patent
Hamaguchi

(10) Patent No.: US 7,582,973 B2
(45) Date of Patent: Sep. 1, 2009

(54) FLIP-CHIP TYPE ASSEMBLY

(75) Inventor: Hiroyuki Hamaguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 239 days.

(21) Appl. No.: 11/545,674

(22) Filed: Oct. 11, 2006

(65) Prior Publication Data

US 2007/0080454 A1    Apr. 12, 2007

(30) Foreign Application Priority Data

Oct. 12, 2005    (JP)    ............................ 2005-297657

(51) Int. Cl.
H01L 23/14    (2006.01)

(52) U.S. Cl. ............... 257/778; 257/700; 257/E23.005; 257/E23.008

(58) Field of Classification Search .................. 257/700, 257/778, E23.005, E23.008
See application file for complete search history.

(56) References Cited

U.S. PATENT DOCUMENTS

2004/0173891 A1*  9/2004  Imai et al. .................... 257/686

FOREIGN PATENT DOCUMENTS

| JP | 11-54884 A | 2/1999 |
| JP | 2000-307025 A | 11/2000 |
| JP | 3629178 B2 | 12/2004 |

* cited by examiner

Primary Examiner—Victor A Mandala
(74) Attorney, Agent, or Firm—Sughrue Mion, PLLC

(57) ABSTRACT

A structure for sufficiently alleviating the thermal stress between an LSI and substrate and allowing the LSI to be detached from a substrate easily is provided. In a flip-chip type assembly according to the present invention, an interposer made of silicon intervenes between the device and the substrate. The LSI and the interposer are connected with a solder and, the interposer and the substrate are connected with a conductive resin. The conductive resin alleviates the thermal stress between the substrate and the interposer. The LSI can be detached easily by heating the solder. The thermal stress between the LSI and the interposer can be reduced because both of them are made of silicon.

15 Claims, 4 Drawing Sheets

FLIP-CHIP TYPE ASSEMBLY

FIELD OF THE INVENTION

The present invention relates to a flip-chip type assembly having a large scale integration (LSI) as a semiconductor chip mounted on a substrate, and to a method of manufacturing the same. The present invention also relates to a flip-chip type assembly in which joints are reliable and an LSI is detachable, and to a method of manufacturing the same.

BACKGROUND OF THE INVENTION

In a flip-chip type assembly mounting electronic parts, it is necessary to alleviate the stress generated between the devices and the substrate. Now, there are various structures for alleviating the stress to the devices.

FIG. 1 shows a conventional flip-chip type-assembly. In order to realize high-speed operation, a bare LSI 2 is used instead of a packaged LSI. A substrate 1 may be an organic substrate. FIG. 1 shows the bare LSI 2 mounted on the substrate 1 using a flip-chip technology.

As shown in FIG. 1, the bare LSI 2 is mounted on the substrate 1 using the flip-chip technology. Electrodes 21 on the LSI 2 are bonded to electrodes 11 on the substrate 1 by solder 6. After that, resin 5 fills space between the substrate 1 and the LSI 2. The resin 5 protects the solder 6.

Coefficients of thermal expansion of the LSI 2 and the substrate 1 are different from each other. The coefficients of thermal expansion of the LSI 2 and the substrate 1 are about 3.5 ppm/° C. and about 15 ppm/° C., respectively. Difference in the coefficients of thermal expansion causes stress. The resin 5 prevents the solder 6 from being broken by the stress. In other words, the solder 6 is protected by the resin 5. However, in a structure shown in FIG. 1, the stress is also applied to the LSI 2. As a result, the LSI 2 is bent by the stress.

An LSI which adopts an $SiO_2$ film is strong in itself, and thus, even when stress is applied to such the LSI which adopts an $Sio_2$ film, the LSI is not broken. However, as an LSI for realizing operation at high speed or more, an LSI using a low-k film is used. The low-k film is a film having low relative permittivity and an interlayer insulating film. Such the low-k film is weak against stress and is fragile. Since the LSI using the low-k film is liable to be broken by stress, the stress is required to be alleviated.

FIG. 2 shows a structure disclosed in Japanese Patent Application Laid-open No. Hei 11-54884. A semiconductor package includes LSI electrodes 21 and a carrier substrate 9. The carrier substrate 9 is made of ceramic. The electrodes 21 on the LSI 2 and electrodes on the carrier substrate 9 are connected by the solder 6. Further, resin 5 fills space between the LSI 2 and the carrier substrate 9. The resin 5 has insulating property. The substrate 1 has substrate 10 mounted thereon. The substrate 10 is made of ceramic. The substrate 10 is used for mounting the semiconductor package thereon. Electrodes on the substrate 10 and the electrodes 11 on the substrate 1 are connected by the solder 6. The resin 5 also fills space between the substrate 1 and the substrate 10. Further, the electrodes on the carrier substrate 9 and the electrodes on the substrate 10 are connected by the solder 6.

Here, the difference between the coefficients of thermal expansion of the ceramic as a material for the carrier substrate 9 and of the ceramic as the material for the substrate 10 is preferably 50% or less. More preferably, the ceramic as the material of the carrier substrate 9 and the ceramic as the material of the substrate 10 are the same. As a result, the coefficients of thermal expansion of the carrier substrate 9 of the semiconductor package and the package receiving substrate 10 are the same or have close values. Thus, the solder 6 is not broken by stress caused due to the difference in the coefficients of thermal expansion is solved.

FIG. 3 shows a structure disclosed in JP 2000-307025 A. The LSI 2 is bonded to an interposer 12 made of ceramic. Connecting terminals 13 are mounted on the interposer 12 on a side opposite to a side facing the LSI 2. The connecting terminals 13 are connected to the electrodes on the LSI 2. Further, the connecting terminals 13 are connected to members 14. The members 14 are formed of resin which is conductive. The members 14 alleviate stress. Metals 15 are formed on the surface of the members 14. The metals 15 can be connected through soldering.

The metals 15 have a trapezoidal shape. More specifically, the area of the metals 15 respectively connected to the members 14 is smaller than the area on the opposite side thereof. In a case of temperature rise, stress is caused due to the difference in the coefficients of thermal expansion between the interposer 12 and the substrate 1. However, since the members 14 are elastically formed, the members 14 absorb the stress. As a result, that solder is not broken.

FIG. 4 shows a structure disclosed in Japanese Patent No. 3629178. Post electrodes 16 are formed on the LSI electrodes 21. Support plates 17 are disposed around the post electrodes 16 so as not to come into contact with the post electrodes 16. The post electrodes 16 are connected to the substrate 1 by metal bumps 19. Further, the post electrodes 16 and the support plates 17 are covered with resin 18 such that only electrode portions are exposed. The post electrodes 16 are deformed under stress. As a result, stress caused due to difference in the coefficients of thermal expansion of the substrate and the LSI is alleviated.

However, in the package structure shown in FIG. 2, the stress caused due to difference in the coefficients of thermal expansion of the LSI 2 and the carrier substrate 9 is applied to the LSI. Therefore, it has little effect on alleviation of stress on the LSI 2. Strength of an LSI using a conventional $SiO_2$ film is strong. Thus, even if stress is applied to the LSI itself, the LSI is not broken. However, since the LSI using the low-k film is fragile, there is a problem that the stress causes breakage of the LSI. Further, since the package structure shown in FIG. 2 includes many joints using solder, the number of process steps in assembling is increased. In addition, since the distance between the LSI and the substrate is large, electric characteristics are deteriorated.

Similarly, in the package structure shown in FIG. 3, thermal stress is caused between the LSI 2 and the interposer 12 because they have different coefficients of thermal expansion. The thermal stress can be absorbed or alleviated by the member 14, which is made of a resin. However, the LSI 2 cannot be detached from the substrate 1 easily by heating because the member 14 connecting them is not made of solder but resin.

In the package structure shown in FIG. 4, the post electrodes 16 are made of metal having high elasticity modulus. Therefore, it has little effect on alleviation of stress on the LSI 2. In addition, the manufacturing of the post electrodes 16 is difficult.

Incidentally, it is desirable that an LSI can be detached from the substrate without damaging itself or the substrate when only the LSI is replaced without replacing other parts on substrate. In the structures shown in FIG. 1 and FIG. 2, the LSI 2 is secured to the substrate or the interposer with the resin 5. Therefore, once the LSI 2 is mounted, it cannot be detached easily from the substrate or the interposer. In the structure shown in FIG. 3 and FIG. 4, it is difficult to detach LSI without damaging the substrate because the members connecting the LSI 2 and the substrate 1 are not solder but the resin and the metal bumps, respectively.

In the structure shown in FIG. 3, resin can be used to fill the space between the interposer and the substrate to alleviate the stress more. However, if the space between the interposer and the substrate is filled with the resin, it becomes much more difficult to detach the LSI 2 from the substrate 1. In other words, in the structure shown in FIG. 3, it is difficult to alleviate the thermal stress sufficiently while allowing the LSI 2 to be detached from the substrate 1 easily.

Accordingly, in order to solve the above-mentioned problems, the present invention provides a structure in which the stress between LSI and substrate is alleviated sufficiently, and LSI can be detached from substrate easily. The connecting member between the LSI and the interposer is removable easily by being heated. In addition, joints are reliable.

SUMMARY OF THE INVENTION

In a flip-chip type assembly according to the present invention, stress caused due to difference in coefficients of thermal expansion of a substrate and an interposer is absorbed through deformation of conductive resin having elasticity and through deformation of resin intervened between the substrate and the interposer. The interposer and an LSI are made of a common material, which is silicon. Since the coefficients of thermal expansion of the interposer and the LSI are substantially the same, substantially no stress is caused between them, and thus, substantially no stress is applied to the LSI. As a result, the LSI is not broken even when the LSI uses a fragile low-k film.

On the other hand, to replace LSI, LSI should be able to be detached without damaging the substrate. However, when LSI and the substrate are connected with the resin, it is difficult to detach LSI without damaging the substrate because the resin is irreversible by being heated. The resin cannot be completely removed by being heated. In order to remove such the conductive resin, it is necessary to clean the electrodes. In a flip-chip type assembly according to the present invention, the LSI is connected to the interposer not with conductive resin but with a connecting member which is removable by heating. For example, the connecting member is a solder. Since the LSI is connected to the interposer through soldering, the LSI can be easily detached by being heated.

BRIEF DESCRIPTION OF THE DRAWINGS

This above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENT

A flip-chip type assembly of the present invention will be described in detail below with reference to the accompanying drawings.

Figure 5:
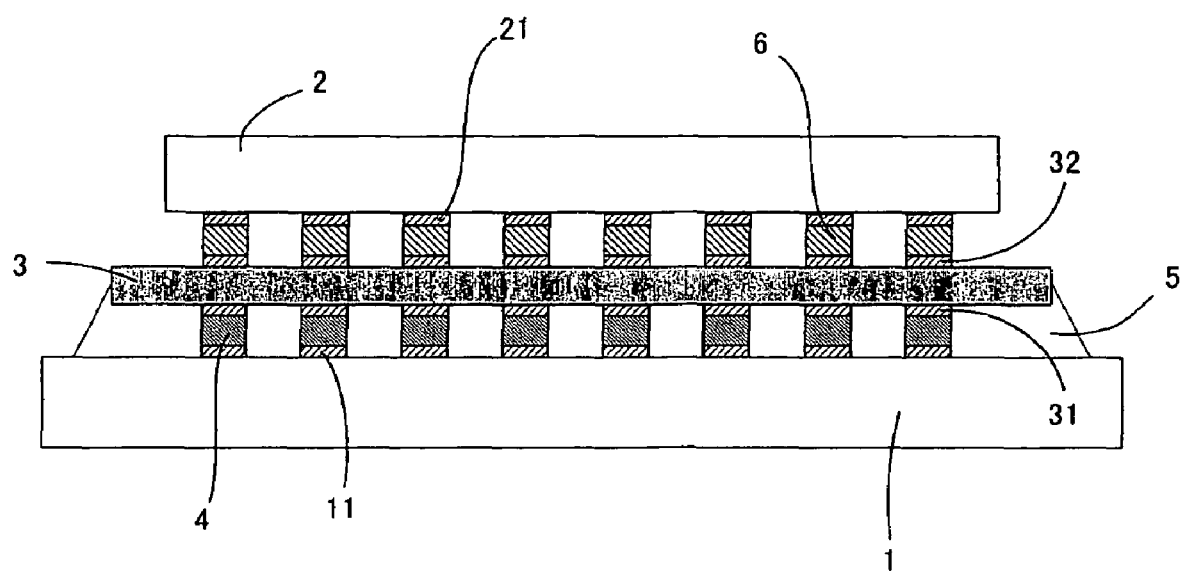
FIG. 5 shows a flip-chip type assembly as a first embodiment according to the present invention.
Figure 7:
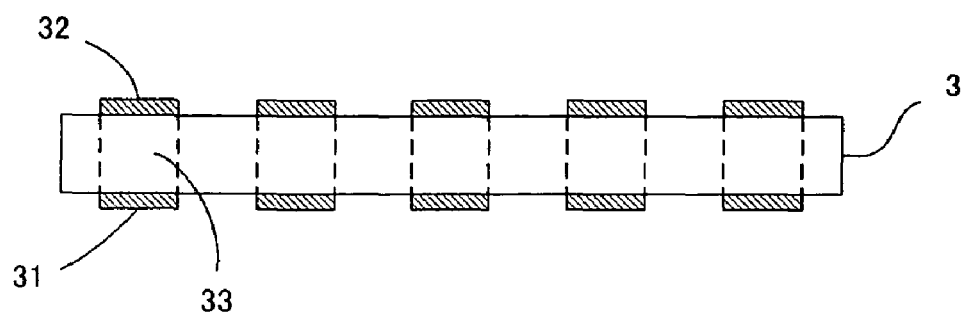
FIG. 7 shows an interposer according to the present invention.

FIG. 5 shows a flip-chip type assembly as a first embodiment according to the present invention. A plurality of electrodes 11 are formed on a surface of a substrate 1. The electrodes 11 are disposed on the surface of the substrate 1 in a lattice-form. An LSI 2 is shown as a semiconductor chip. A plurality of electrodes 21 are formed on a surface of the LSI 2. The electrodes 21 are disposed on the surface of the LSI 2 in a lattice-form. An interposer 3 is disposed above the substrate 1. Outer dimensions of the interposer 3 are the same as or larger than those of the LSI 2. The interposer 3 is made of silicon. A first surface of the interposer 3 has a plurality of first electrodes 32 formed thereon. The electrodes 32 are used to connect the LSI 2 to the interposer 3. A second surface of the interposer 3 has a plurality of second electrodes 31 formed thereon. The electrodes 31 are used to connect the substrate 1 to the interposer 3. The electrodes 31 and 32 are disposed on the second and first surfaces of the interposer 3, respectively, in a lattice-form. As shown in FIG. 7, the electrodes 32 are electrically connected to the electrodes 31 through vias 33 which pass through the interposer 3 in a direction of thickness. The electrodes 11 are connected to the electrodes 31 with resin 4 as a first resin. The resin 4 is conductive and has low elasticity. The elasticity modulus of the resin 4 is from about 1 MPa to about 3 MPa. Resin 5 as a second resin fills space between the substrate 1 and the interposer 3. Joints of the resin 4 are protected by the resin 5. The resin 5 has insulating property. The electrodes 21 are connected to the electrodes 32 by the solder 6.

The resin 4 and the solder 6 are in the shape of spheres, cylinders, or barrels. The diameters of the resin 4 and the solder 6 are preferably about 50% to about 70% of the distance between the electrodes. Further, the heights of the resin 4 and the solder 6 are preferably about 40% to about 60% of the diameters of the resin 4 and the solder 6. However, the shape, the diameter, and the height of the resin 4 are not required to be the same as those of the solder 6.

A method of manufacturing the flip-chip type assembly is now described. First, the resin 4 is supplied on to the electrodes 11. Then, the interposer 3 is disposed such that the resin 4 and the electrodes 31 are connected to each other. The electrodes 11 are connected to the electrodes 31 via the resin 4. The resin 4 may include a thermosetting resin. A thermosetting resin is cured when heated. Once a thermosetting resin is cured, the thermosetting resin does not return to its initial state even if it is heated again.

Then, the resin 5 is filled into the space between the substrate 1 and the interposer 3. After that, the resin 5 is cured by heating. The joints of the resin 4 are protected by the resin 5. The resin 5 is made to fill the space of about 100 μm between the substrate 1 and the interposer 3 using capillary action.

After that, the solder 6 is supplied onto the electrodes 32 on the interposer 3. The solder 6 is heated after the LSI 2 is mounted. The LSI electrodes 21 are connected to the electrodes 32 on the interposer 3 by the solder 6.

Operation of the flip-chip type assembly according to the present invention is now described. In the structure according to the present invention, the substrate 1 is connected to the interposer 3 by the resin 4. Further, the substrate 1 is fixed and secured to the interposer 3 by the resin 5. Because the conductive resin 4 is elastic, stress caused due to difference in coefficients of thermal expansion of the substrate 1 and the interposer 3 is absorbed through deformation of the resin 4 and the resin 5.

Figure 1:
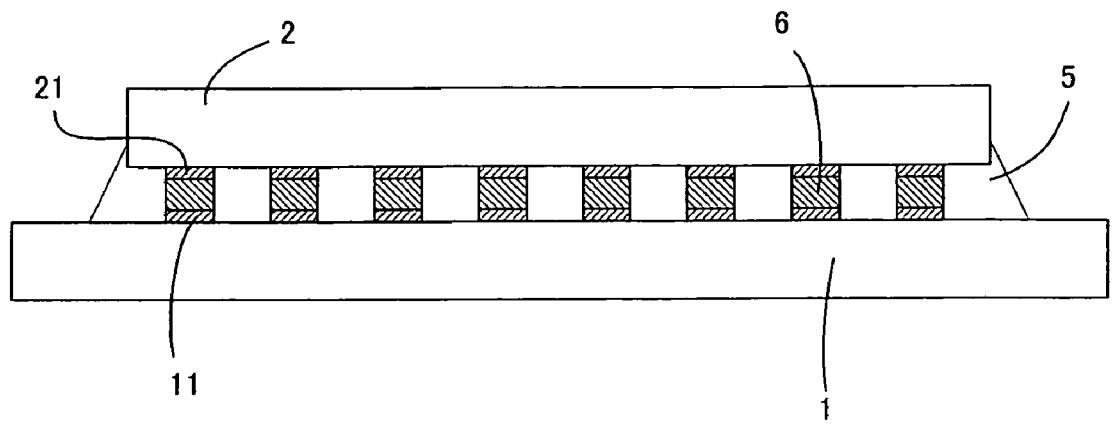
FIG. 1 shows a conventional package structure.
Figure 2:
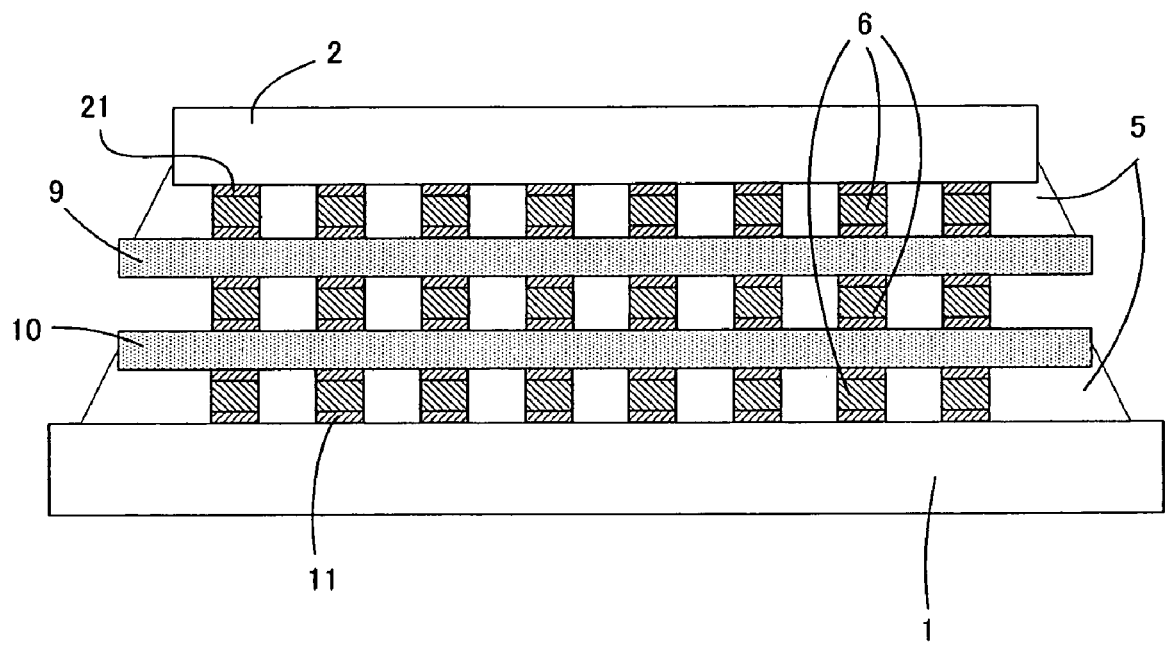
FIG. 2 shows another conventional package structure.
Figure 3:
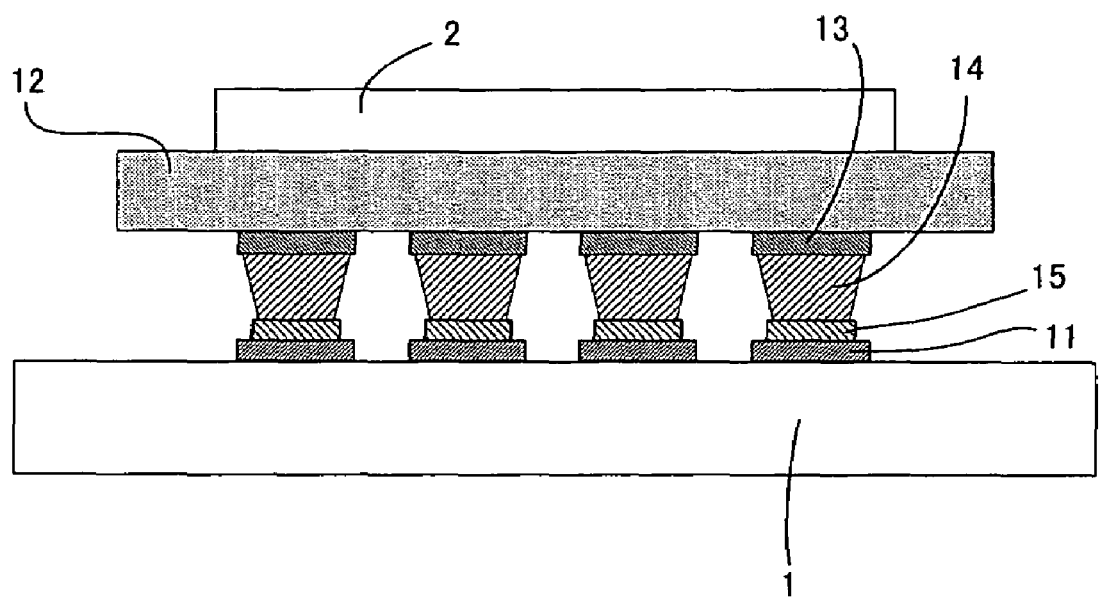
FIG. 3 shows still another conventional package structure.
Figure 4:
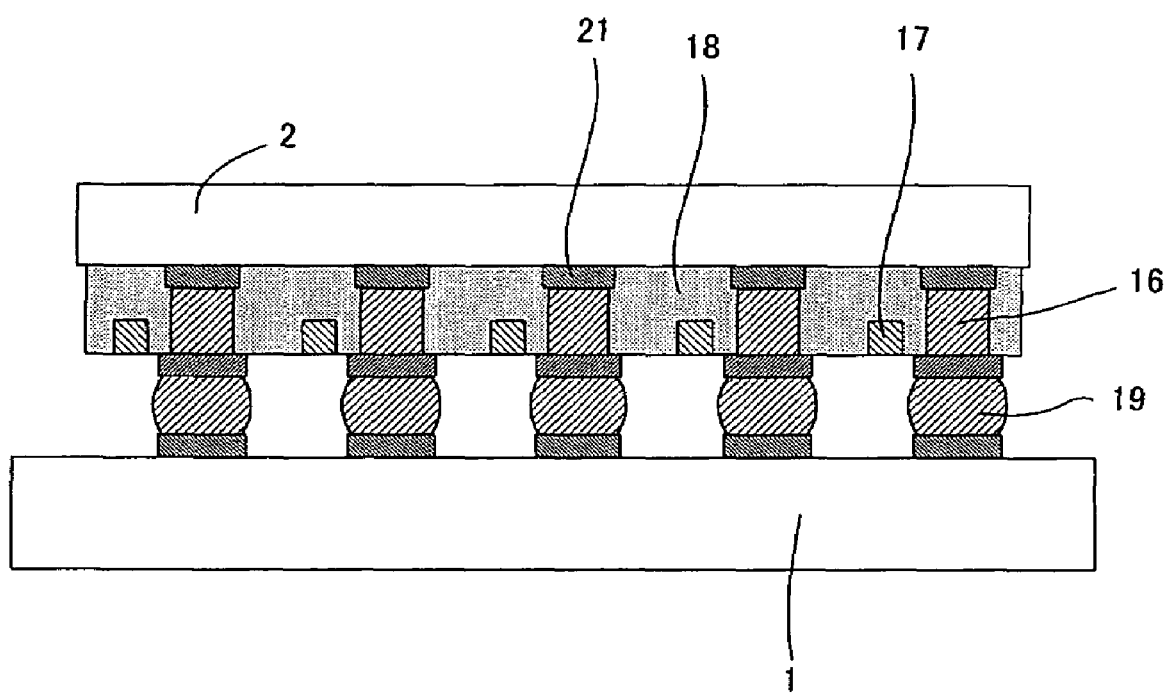
FIG. 4 shows yet another conventional package structure.

In the package structure shown in FIG. 1, the solder 6 is used as a connecting member. The solder 6 is less elastic than the resin 4, and its elasticity modulus of the solder is about 30,000 MPa. When such the solder is used to connect materials having different coefficients of thermal expansion, stress cannot be absorbed by the solder. As a result, the stress is applied to the joints. A structure according to the present invention solves the problem described above by the use of the resin 4.

Further, the interposer 3 and the LSI 2 are made of the common material, which is silicon, to have substantially the same coefficients of thermal expansion. As a result, substantially no thermal stress is caused between the interposer 3 and the LSI 2. Since no stress is applied to the LSI 2, even an LSI using a fragile low-k film is not broken. The coefficients of thermal expansion of the interposer 3 and the LSI 2 are each about 3.5 ppm/° C.

Further, since substantially no thermal stress is caused between the interposer 3 and the LSI 2, the LSI 2 can be connected to the interposer 3 with soldering, and thus, the LSI 2 can be detached by being heated again. Namely, the resin 4 absorbs the thermal stress, and the solder 5 allows the LSI 2 to be easily detached by heating.

Figure 6:
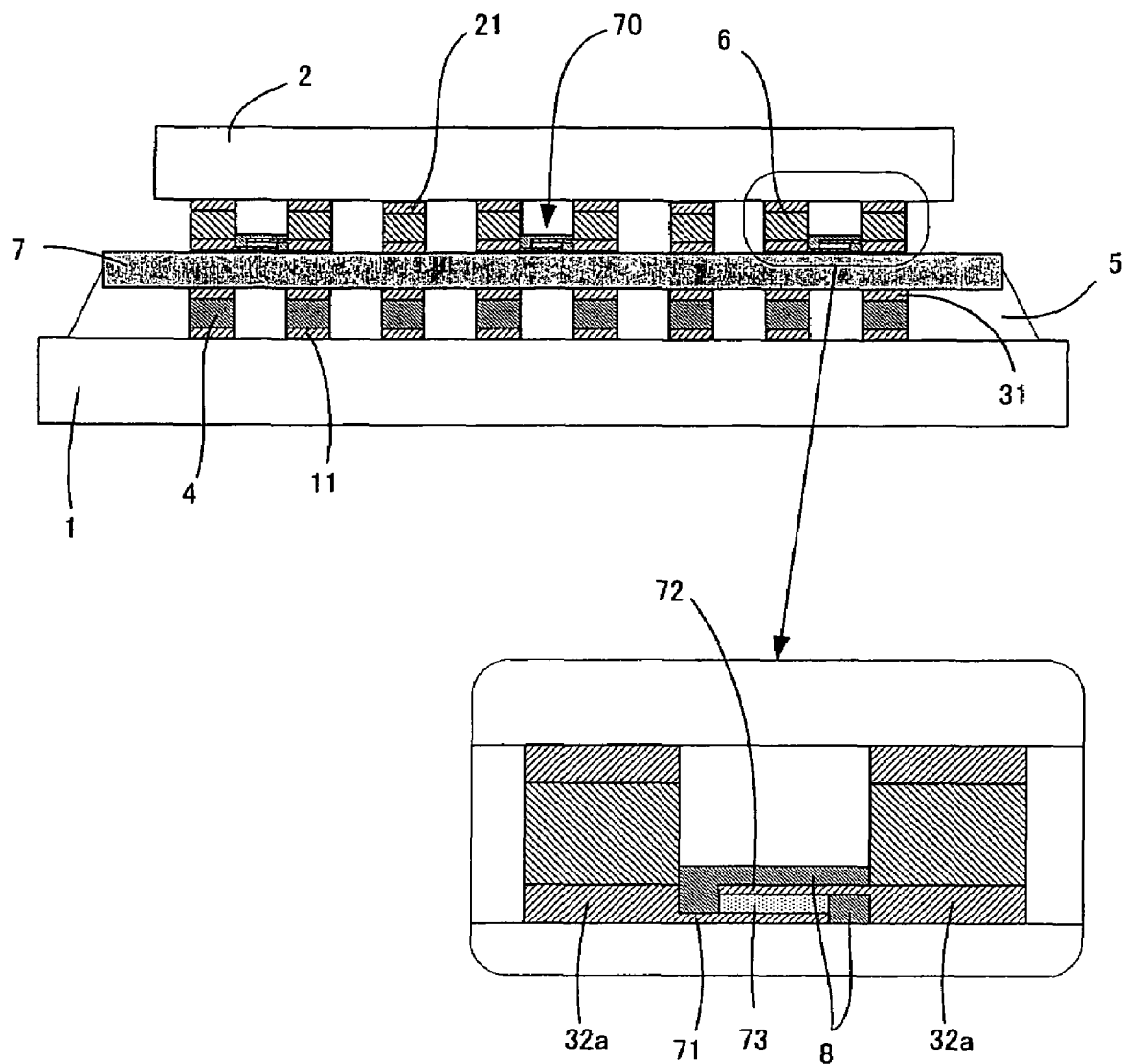
FIG. 6 shows a flip-chip type assembly as a second embodiment according to the present invention.

FIG. 6 shows a structure of joints of a second embodiment according to the present invention. In FIG. 6, elements which are the same as those shown in FIG. 5 bear the common reference numerals, and detailed description thereof is abbreviated. A couple of electrodes 32a, which are a part of electrodes 32 on an interposer 7, are adjacent to each other. The electrode 32a have an electrode 71 and an electrode 72 formed thereon, respectively, which protrude toward each other and in parallel to each other. A dielectric 73 is sandwiched between the electrodes 71 and 72. The electrode 71, the electrode 72, and the dielectric 73 are covered with a protective film 8. In this way, the electrode 71, the electrode 72, and the dielectric 73 form a capacitor 70. The capacitor 70 is formed on the interposer 7. This adds a function as a capacitor to the interposer 7. The capacitor 70 acts as a part of a power supply of the LSI 2. Since such the power supply is on the interposer 7, the distance between the LSI 2 and the power supply is shortened. As a result, noise due to a high frequency wave generated with respect to the LSI 2 is reduced.

It is to be noted that, in the present invention, the substrate 1 may be a ceramic substrate. This is because the stress caused due to difference in the coefficients of thermal expansion of the substrate and the interposer is absorbed through deformation of the resin. The coefficient of thermal expansion of such the ceramic substrate is about 9 ppm/° C.

Further, the substrate 1 is preferably a substrate which functions as a buildup substrate. This makes possible a high density multilayer wiring.

The present invention has been described in detail. However, it should be appreciated that various changes may be made to the present invention without departing from its spirits and be covered by the claims.

Furthermore, it is the inventor's intent to retain all equivalents of the claimed invention even if the claims are amended during prosecution.

What is claimed is:

1. A flip-chip type assembly comprising:
   a substrate;
   an interposer;
   a semiconductor chip;
   a first resin electrically connecting said substrate and said interposer, wherein said first resin has elasticity;
   a second resin intervening between said substrate and said interposer, said second resin having a less electrical conductivity than said first resin, and
   a solder electrically connecting said interposer and said semiconductor chip.

2. A flip-chip type assembly according to claim 1, wherein said semiconductor chip and said interposer are made of a substantially common material.

3. A flip-chip type assembly according to claim 2, wherein said common material is silicon.

4. A flip-chip type assembly according to claim 1, wherein coefficients of thermal expansion of said semiconductor chip and said interposer are substantially the same.

5. A flip-chip type assembly according to claim 4, wherein said coefficient of thermal expansion is about 3.5 parts per million (ppm).

6. A flip-chip type assembly according to claim 1, wherein a capacitor is formed on said interposer.

7. A flip-chip type assembly according to claim 1, wherein said melting point of solder is lower than the melting point of said first resin.

8. A flip-chip type assembly according to claim 1, wherein said first resin is thermosetting resin and irreversible by heating.

9. A flip-chip type assembly according to claim 1, wherein said interposer has first and second surfaces, said interposer has first and second electrodes on said first and second surfaces, respectively, and said first and second electrodes are connected electrically.

10. A flip-chip type assembly according to claim 1, wherein said solder connects between one of electrodes on said semiconductor chip and one of electrodes on said interposer, said first resin connects between one of electrodes on said interposer and one of electrodes on said substrate, and said electrodes are arranged in a lattice-form on surfaces of said semiconductor chip, said interposer, and said substrate.

11. A flip-chip type assembly according to claim 1, wherein the size of said interposer is equal to or larger than the size of said semiconductor chip.

12. A flip-chip type assembly according to claim 1, wherein said substrate is made of ceramic.

13. A flip-chip type assembly comprising:
   a substrate;
   an interposer;
   a semiconductor chip;
   a first resin electrically connecting said substrate and said interposer, wherein said first resin has elasticity;
   a second resin intervening between said substrate and said interposer, said second resin having a less electrical conductivity than said first resin, and
   a connecting member electrically connecting said interposer and said semiconductor chip, wherein said connecting member is removable by heating.

14. A flip-chip type assembly comprising:
   a substrate;
   an interposer;
   a semiconductor chip;
   a first resin electrically connecting said substrate and said interposer, wherein said first resin has elasticity, and
   a solder electrically connecting said interposer and said semiconductor chip, wherein an elasticity modulus of said first resin is from about 1 MPa to about 3 MPa.

15. A flip-chip type assembly comprising:
   a substrate;
   an interposer;

a semiconductor chip;
a first resin electrically connecting said substrate and said interposer, wherein said first resin has elasticity, and
a connecting member electrically connecting said interposer and said semiconductor chip, wherein said connecting member is removable by heating, wherein an elasticity modulus of said first resin is from about 1 MPa to 3 MPa.

* * * * *